United States Patent [19]

Fiedelius

[11] Patent Number: 5,063,660
[45] Date of Patent: Nov. 12, 1991

[54] METHOD FOR MANUFACTURING PREFORMS COATED WITH HARD SOLDER FOR REPAIRING INTERCONNECT INTERRUPTIONS

[75] Inventor: Gerhard Fiedelius, Berg, Fed. Rep. of Germany

[73] Assignee: Siemens Aktiengesellschaft, Munich, Fed. Rep. of Germany

[21] Appl. No.: 324,021

[22] Filed: Mar. 16, 1989

[30] Foreign Application Priority Data

May 26, 1988 [DE] Fed. Rep. of Germany ....... 3817902

[51] Int. Cl.⁵ ............................................. H01R 43/00
[52] U.S. Cl. ...................................... 29/885; 156/634;
156/656; 156/659.1; 228/56.3
[58] Field of Search ................ 29/885; 156/656, 659.1,
156/634; 204/192.15; 228/56.3, 119

[56] References Cited

U.S. PATENT DOCUMENTS

| | | | |
|---|---|---|---|
| 3,617,373 | 11/1971 | Mott | 204/192.15 |
| 4,597,828 | 7/1986 | Tadros | 156/656 |
| 4,620,365 | 11/1986 | Burger et al. | 204/192.15 |
| 4,803,110 | 2/1989 | Ahn et al. | 204/192.15 |

FOREIGN PATENT DOCUMENTS

| | | |
|---|---|---|
| 2251997 | 3/1974 | Fed. Rep. of Germany . |
| 3025875A1 | 2/1982 | Fed. Rep. of Germany . |

OTHER PUBLICATIONS

"Open Conductor Repair for Glass Metal Module" by F. M. Tappen, IBM Technical Disclosure Bulletin, vol. 14, No. 10 dated Mar. 1972, p. 2915.

Primary Examiner—P. W. Echols
Attorney, Agent, or Firm—Hill, Van Santen, Steadman & Simpson

[57] ABSTRACT

A method for manufacturing preforms coated with hard solder for repairing interconnect interruptions. The manufacture of preforms with which interconnect interruptions are bridged and that are electrically and mechanically joined to the interconnect at both sides of the interruption was previously carried out by punching from a metal band coated with hard solder. In the course of the miniaturization of interconnects to a width of less than 100 μm, such a punching method is no longer feasible. The present etching technique provides a preform panel having a plurality of preforms, whereby, a hard solder layer has not yet been applied to the metal band at the point in time of etching. This avoids what are referred to as under-etchings. The method provides that a hard solder layer is applied by sputtering on the etched-out preform that is merely composed of a substrate that was manufactured from the metal band.

8 Claims, 1 Drawing Sheet

METHOD FOR MANUFACTURING PREFORMS COATED WITH HARD SOLDER FOR REPAIRING INTERCONNECT INTERRUPTIONS

BACKGROUND OF THE INVENTION

The present invention is directed to a method for manufacturing preforms coated with hard solder for repairing interconnect interruptions, particularly for repairing meander-shaped interconnects whose width, for example, lies in the range from 50 through 70 $\mu$m.

For repairing regularly occurring interconnect interruptions, preforms corresponding to the interconnect structure are placed bridge-like on the defective interconnect approximately congruently relative to the interconnect in the area of the interrupt or defect and are joined to the interconnect at both sides of the interruption. German Patent 2 251 997 discloses a method with which such preforms that are composed of a fine band coated with hard solder are processed. German Publish Application 30 25 875 discloses an apparatus related thereto for repairing interconnect interruptions. This prior art apparatus is composed of an electrode system that produces the connection between a preform and an interconnect by resistance heating. Interconnects and corresponding preforms having a width of about 100 through 150 $\mu$m are disclosed in both publications. As a consequence of their relatively large dimension, such preforms can be punched with a press tool. A completely plated preform results following the punching process due to the use of a plated metal band.

Since technical progress has now made possible a miniaturization of the interconnects down to a width of 50 through 70 $\mu$m, for example, a correspondingly small preform is required for repairing these interconnects. However, traditional pressing techniques, when a preform is punched with a punch that has the same geometry, fail here. Utilizing the etching techniques standard for the manufacture of printed circuits for producing the abovedescribed preforms has similar difficulties. A metal band that has already been plated is etched to different degrees by an etchant, i.e. is etched very differently dependent on the existing material. This leads to pronounced under-etchings of the preform, when, for example, a preform plated with hard solder is manufactured from a copper band plated with hard solder. The etchant attacks the copper band, the substrate, far more extensively than it attacks the hard solder plating. The use of different etchants has not lead to a satisfactory result in the prior art.

SUMMARY OF THE INVENTION

An object of the present invention is to provide a method with which qualitatively high-grade preforms can be fabricated that are suitable for utilization when repairing an interconnect interruption.

This object is achieved in that one or more preforms are first etched from a metal band that is not plated and that these preforms are subsequently provided with a hard solder layer by sputtering.

The present invention is based on the perception that preforms coated with hard solder for repairing interconnect interruptions can only be manufactured in a first method step from a metal band that is not yet plated. In order to avoid pronounced under-etchings, the preforms are etched from the bare metal band. The coating with a layer of hard solder occurs afterward by sputtering, a method of cathode evaporation. This leads to a preform having a uniformly applied hard solder layer that has no significant, lateral over-hangs of the hard solder layer or pronounced cavities at the substrate, the metal band, and that, moreover, has adequate electrical and mechanical properties for utilization when repairing interconnect interruptions.

An advantageous development of the invention provides for the production of a preform panel in which a plurality of preforms are contained. The advantages of this procedure lie in the holding of a plurality of preforms within this preform panel since a frame-shaped part of the metal band is preserved as a carrier following the etching event. Moreover, the method step of sputtering can be successively carried out for a plurality of preforms.

In order to adapt the preform to the materials of the interconnects, it is expedient to use a metal band of copper.

The best results can be achieved by utilizing a silver hard solder.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
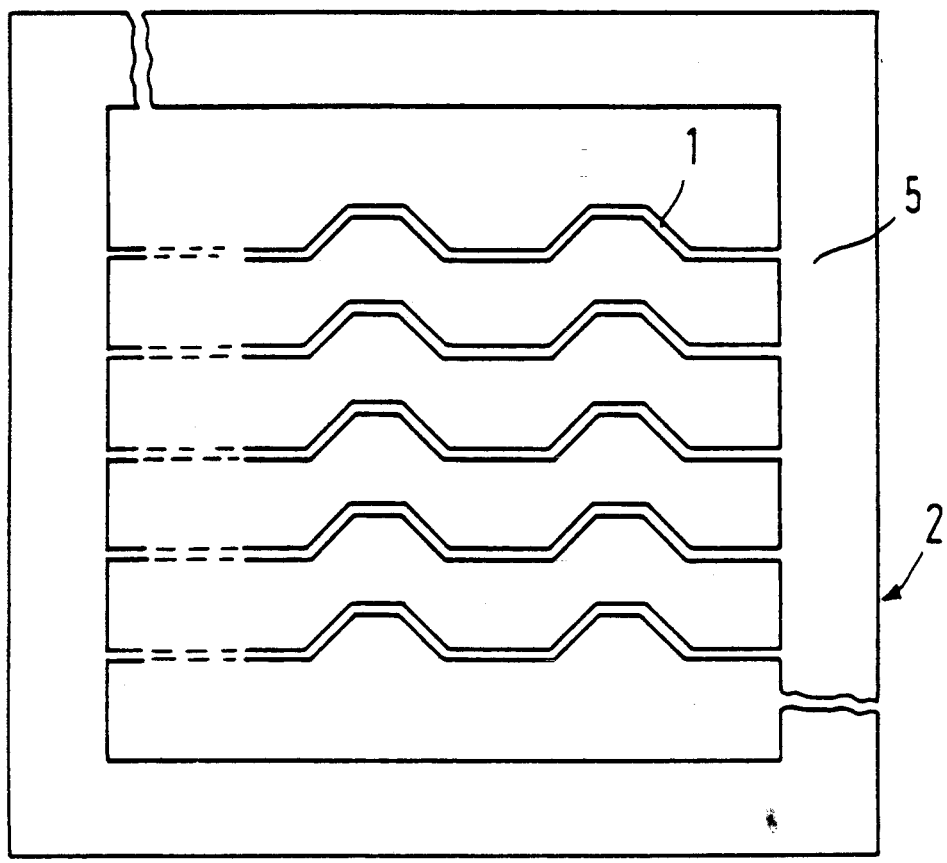
FIG. 1 is a plan view showing a preform panel 2 that was produced from a metal band 5 by etching and that contains a plurality of preforms 1.

FIG. 1 shows a preform panel 2 that was manufactured from a metal band 5. After the etching process, a stable surrounding frame remains from the metal band, this frame enveloping the remaining preforms 1. A plurality of preforms 1 can thus be simultaneously processed because of the mechanical retention at the remaining frame of the metal band 5. The preforms 1 are sputtered following the etching process that yields the preform panel 2 as shown in FIG. 1. As a result all interspaces that are etched out as well as the frame that remains need not be provided with a hard solder layer, this, among other things, leading to savings in materials.

Figure 2:
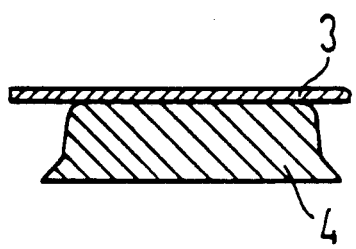
FIG. 2 shows a cross section through a prior art preform 1 after being etched out of a metal band that is already plated.

FIG. 2 shows the cross section through a prior art preform (1) that was etched out of a previously plated metal band. The pronounced under etching can be clearly seen therein. The different degrees to which the etchant attacks the different materials results in overhangs of the hard solder layer 3 and to non-uniform hollows at the metal band 5, referred to here as substrate 4.

Figure 3:
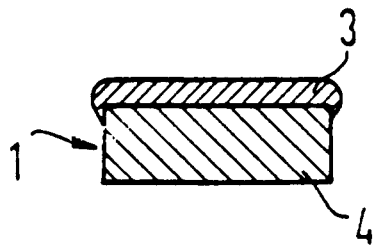
FIG. 3 shows a cross section through a preform 1 after being etched out of a non-plated metal band 5 and after subsequent sputtering with a hard solder layer 3.

FIG. 3 shows a cross section through a preform 1 produced in accordance with the method of the present invention The preform 1 is composed of the substrate 4 that was obtained from the metal band 5 by etching techniques and that is provided with a hard solder layer 3 on one side. This hard solder layer 3 having been applied uniformly and with good mechanical adhesion, projects slightly at the sides, exhibits no irregularities whatsoever and has the electrically and mechanically required properties that are necessary for a repair of an interconnect interruption. Hard solders composed of "AgCu 10" as well as "L-Ag 28" are especially suited for the production of a hard solder layer 3 by sputtering.

Further advantages of this method are that the shaping of the preforms 1 can be varied short-term to correspond to various interconnect geometries. For implementing an interconnect repair, the preforms 1 are punched correspondingly overlapping relative to the interconnect interruption and are provided for the repair procedure.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for manufacturing preforms coated with hard solder for repairing interconnect interruptions, particularly for repairing meander-shaped interconnects, comprising the steps of:
   first etching preforms from a metal band and, subsequently,
   applying a hard solder layer to at least one surface of the preforms by sputtering.

2. The method according to claim 1, wherein a preform panel having a plurality of preforms is produced from the metal band.

3. The method according to claim 1, wherein the metal band is copper.

4. The method according to claim 1, wherein a silver hard solder is applied for producing the hard solder layer.

5. A method for manufacturing preforms coated with hard solder for repairing interconnect interruptions, particularly for repairing meander-shaped interconnects, comprising the steps of:
   etching the preforms from a metal band to form a preform panel having a plurality of preforms; and
   applying a hard solder layer to at least one surface of at least the preforms by sputtering.

6. Method according to claim 5, wherein the metal band is copper.

7. Method according to claim 5, wherein a silver hard solder is applied for producing the hard solder layer.

8. A method for manufacturing preforms coated with hard solder comprising:
   etching the preforms from a copper metal band to form a preform panel having a plurality of preforms; and
   applying silver hard solder to at least one surface of at least one of the preforms to provide a hard solder layer by sputtering.

* * * * *